United States Patent
Sako

(10) Patent No.: US 7,940,458 B2
(45) Date of Patent: May 10, 2011

(54) LASER LIGHT SOURCE DEVICE, HOLOGRAM APPARATUS, AND METHOD FOR DETECTING LASER LIGHT

(75) Inventor: Kageyasu Sako, Tokyo (JP)

(73) Assignee: Sony Corporation (JP)

( * ) Notice: Subject to any disclaimer, the term of this patent is extended or adjusted under 35 U.S.C. 154(b) by 135 days.

(21) Appl. No.: 11/250,326

(22) Filed: Oct. 14, 2005

(65) Prior Publication Data

US 2006/0114535 A1    Jun. 1, 2006

(30) Foreign Application Priority Data

Oct. 18, 2004    (JP) ................ P2004-303146

(51) Int. Cl.
*G02B 5/18* (2006.01)

(52) U.S. Cl. ........... 359/572; 359/569

(58) Field of Classification Search .......... 359/569, 359/572

See application file for complete search history.

(56) References Cited

U.S. PATENT DOCUMENTS

| | | | | |
|---|---|---|---|---|
| 5,430,548 A | * | 7/1995 | Hiroi et al. .............. | 356/394 |
| 6,781,947 B2 | * | 8/2004 | Motegi et al. ........... | 369/112.28 |
| 6,803,153 B1 | * | 10/2004 | Kawano et al. .......... | 430/1 |
| 6,951,715 B2 | * | 10/2005 | Cunningham et al. ...... | 435/4 |
| 2002/0196823 A1 | * | 12/2002 | Nakao et al. ............. | 372/32 |

FOREIGN PATENT DOCUMENTS

| | | |
|---|---|---|
| JP | 3-185887 A | 8/1991 |
| JP | 4-109561 A | 4/1992 |
| JP | 4-176175 A | 6/1992 |
| JP | 7-099359 A | 4/1995 |
| JP | 9-129959 A | 5/1997 |
| JP | 11-107377 | 4/1999 |
| JP | 2000-353854 | * 12/2000 |
| JP | 2002-204023 A | 7/2002 |
| JP | 2004-039158 A | 2/2004 |
| JP | 2004-069333 A | 3/2004 |
| JP | 2004-093910 A | 3/2004 |

* cited by examiner

*Primary Examiner* — Joshua L Pritchett
(74) *Attorney, Agent, or Firm* — Lerner, David, Littenberg, Krumholz & Mentlik, LLP

(57) ABSTRACT

A laser light source device may include a laser diode, first and second optical elements, a diffraction grating, and a detector. The first optical element may collimate laser light emitted from the laser diode. The diffraction grating may reflect zero-order light in the collimated laser light in a predetermined direction other than a direction toward the laser diode and may reflect first-order light in the collimated laser light toward the laser diode. The second optical element may reflect the zero-order light reflected by the diffraction grating in a predetermined direction while transmitting a part of the zero-order light reflected by the diffraction grating. The detector may detect at least one of a wavelength and an intensity of the light that passes through the second optical element.

3 Claims, 8 Drawing Sheets

FIG. 7
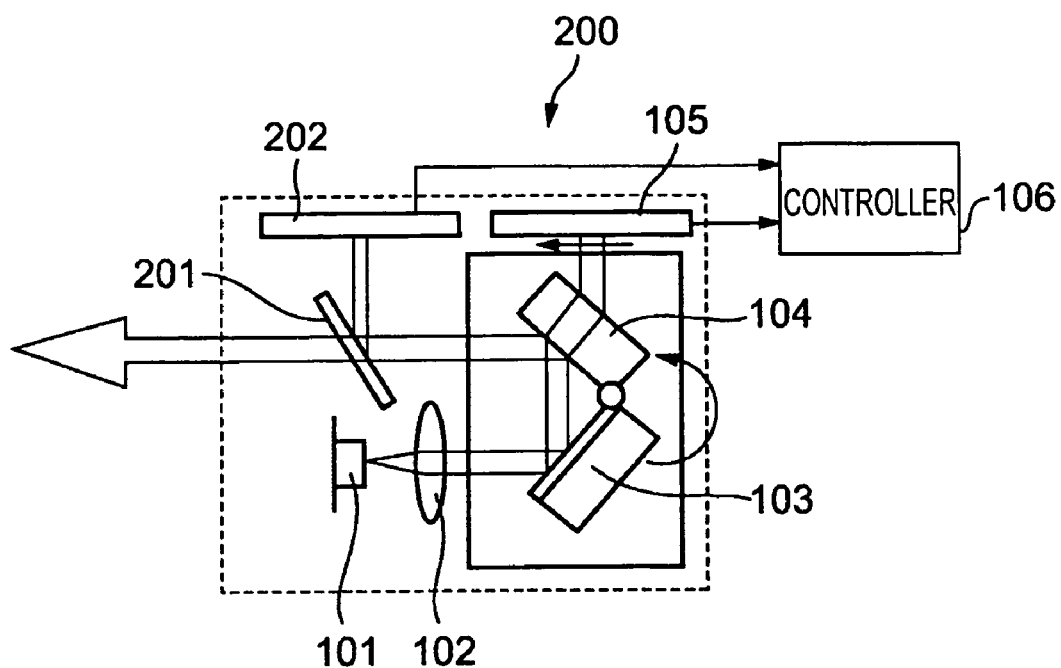
FIG. 8
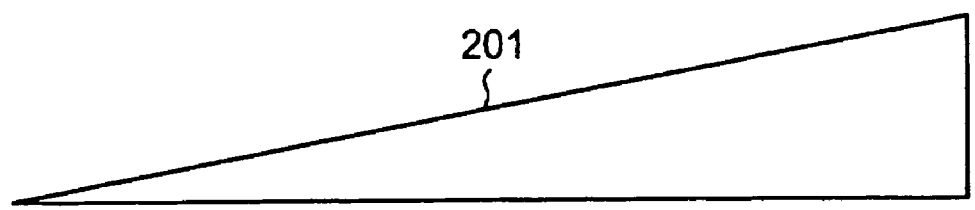
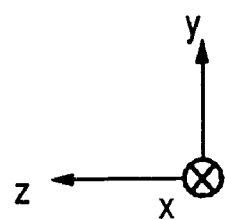

LASER LIGHT SOURCE DEVICE, HOLOGRAM APPARATUS, AND METHOD FOR DETECTING LASER LIGHT

CROSS-REFERENCE TO RELATED APPLICATIONS

The present application claims priority from Japanese Patent Application No. JP 2004-303146 filed on Oct. 18, 2004, the disclosure of which is hereby incorporated by reference herein.

BACKGROUND OF THE INVENTION

The present invention relates to a laser light source device used for, for example, recording and reproducing a hologram, a hologram apparatus using the laser light source device, and a method for detecting laser light.

Hologram recording apparatuses for recording data using holography have been developed. In a typical hologram recording apparatus, modulated signal light (light in which data is superimposed) and unmodulated reference light are generated from laser light and are radiated onto a hologram-recording medium at the same position. Accordingly, the signal light and the reference light interfere with each other on the hologram-recording medium to form a diffraction grating (hologram) at the irradiation point, and thus data is recorded on the hologram-recording medium.

When the hologram-recording medium on which the data is already recorded is irradiated with the reference light, diffracted light (reproducing light) is generated by the diffraction grating formed in the recording process. The reproducing light includes the data superimposed on the signal light in the recording process. Therefore, the recorded signal can be reproduced by receiving the reproducing light with a light-receiving element.

In general, single-mode laser light sources having extremely high coherence are used as hologram recording/reproducing light sources, and gas lasers, second harmonic generation (SHG) lasers, etc., are used. A conventional laser diode does not have sufficient coherence because of a multimode type. However, a hologram recording/reproducing light source with high coherence can be obtained by forming an external cavity laser. Accordingly, external cavity lasers using compact, power-saving blue laser diodes can also be used as hologram light sources.

In addition, wavelength reproducibility is important in hologram recording. In particular, when wavelength division multiplexing in which the wavelength is varied is performed, the wavelength of the output light is adjusted to a desired wavelength. In that case, a tunable external cavity laser, for example, may be used.

A Littrow type, for example, may be used as the external cavity. In this external cavity, a laser beam emitted from a laser diode is collimated by a collimating lens, and is radiated onto a reflective diffraction grating. The beam reflected by the diffraction grating is divided into zero-order light and first-order light. The first-order light returns to the laser diode along the optical path along which the laser beam has traveled from the laser diode to the diffraction grating. The returned laser beam serves to form a cavity including the reflective diffraction grating and the laser diode, and the laser diode oscillates at a wavelength determined by the pattern of the reflective diffraction grating and the distance between the reflective diffraction grating and the laser diode (see Japanese Unexamined Patent Application Publication No. 11-107377, paragraphs [0028] to and FIG. 1).

In the above-described tunable external cavity laser, the wavelength and intensity of laser light being output are detected. In addition, detecting means for detecting the wavelength and intensity that has a simple structure and that contributes to size reduction of the device is demanded.

In light of the above-described situation, it is desirable to provide a small laser light source device with a simple structure that can detect the wavelength and intensity of light, a hologram apparatus using the laser light source device, and a method for detecting laser light.

SUMMARY OF THE INVENTION

A laser light source device according to an embodiment of the present invention includes a laser light source that emits multimode laser light; a first optical element that collimates the laser light emitted from the laser light source; a diffraction grating that reflects zero-order light in the collimated laser light in a predetermined direction other than a direction toward the laser light source and reflects first-order light in the collimated laser light toward the laser light source; a second optical element that reflects the zero-order light reflected by the diffraction grating in a predetermined direction while transmitting a part of the zero-order light reflected by the diffraction grating; and first detecting means that detects at least one of a wavelength and an intensity of the light that passes through the second optical element.

A partially transmissive mirror, for example, may be used as the second optical element.

The refracting direction of light that passes through the partially transmissive mirror differs depending on the wavelength thereof. Accordingly, the wavelength of the light can be determined by detecting the difference in the refracting direction using the first detecting means. In addition, the intensity of light can be determined by directly detecting the light that passes through the partially transmissive mirror with the first detecting means. When the wavelength of light is detected, a split photodetector or a position detector, for example, may be used as the first detecting means. When only the intensity of light is detected, a commonly used photodetector, for example, may be used.

According to the embodiment of the present invention, the partially transmissive mirror that reflects light in a predetermined direction while transmitting a part of the light may be used as the second optical element. In such a case, it is not necessary to use an additional optical element, for example, a half mirror, to guide the light toward means for detecting the wavelength or intensity. Accordingly, the structure is made simpler and the device size is reduced.

The laser light source device may further include changing means for changing an incidence angle of the laser light on a reflective surface of the diffraction grating while maintaining an angle between the reflective surface of the diffraction grating and a reflective surface of the second optical element at a constant angle.

The oscillation wavelength can be changed by changing the incidence angle of the laser light on the reflective surface of the diffraction grating. Since the angle between the reflective surface of the diffraction grating and the reflective surface of the second optical element is maintained at a constant angle, the emission direction of the laser light can be kept constant.

The laser light source device may further include control means for controlling the changing means on the basis of the wavelength detected by the first detecting means. In such a case, the wavelength of light can be accurately controlled with a simple structure.

The laser light source device may further include a shear plate disposed in an optical path of the light reflected by the second optical element and second detecting means for detecting a wavelength of light reflected by the shear plate. A split photodetector, for example, may be used as the second detecting means.

An optical wedge, for example, may be used as the shear plate. Interference fringes are formed by the difference in wavelength between light reflected by the front surface and light reflected by the back surface. The second detecting means detects the wavelength of light on the basis of the interference fringes. Accordingly, the wavelength can be more accurately detected compared to the case in which the first detecting means is used. When the second detecting means is used together with the first detecting means, the wavelength can be detected still more accurately in a wider range.

According to another embodiment of the present invention, a hologram apparatus for recording or reproducing a hologram on a hologram-recording medium by wavelength division multiplexing includes a laser light source device including a laser diode that emits multimode laser light; a first optical element that collimates the laser light emitted from the laser diode; a diffraction grating that reflects zero-order light in the collimated laser light in a predetermined direction other than a direction toward the laser diode and reflects first-order light in the collimated laser light toward the laser diode; a second optical element that reflects the zero-order light reflected by the diffraction grating in a predetermined direction while transmitting a part of the zero-order light reflected by the diffraction grating; and first detecting means that detects at least one of a wavelength and an intensity of the light that passes through the second optical element.

According to this embodiment of the present invention, a small device with a simple structure that can detect the wavelength and intensity of light is provided.

In the hologram apparatus, the laser light source device may further include changing means for changing an incidence angle of the laser light on a reflective surface of the diffraction grating while maintaining an angle between the reflective surface of the diffraction grating and a reflective surface of the second optical element at a constant angle.

In addition, the laser light source device may further include control means for controlling the changing means on the basis of the wavelength detected by the first detecting means.

In addition, the laser light source device may further include a shear plate disposed on an optical path of the light reflected by the second optical element and second detecting means for detecting a wavelength of light reflected by the shear plate.

According to another embodiment of the present invention, a method for detecting laser light includes emitting multimode laser light; collimating the emitted laser light; reflecting zero-order light in the collimated laser light in a predetermined direction other than a direction toward an emission point and reflecting first-order light in the collimated laser light toward the emission point; reflecting the reflected zero-order light in a predetermined direction while transmitting a part of the reflected zero-order light; and detecting at least one of a wavelength and an intensity of the transmitted light.

According to this embodiment of the present invention, a small device with a simple structure that can detect the wavelength and intensity of light is provided.

According to the above-described embodiments of the present invention, the second optical element reflects the zero-order light reflected by the diffraction grating in a predetermined direction while transmitting a part of the zero-order light reflected by the diffraction grating, and at least one of a wavelength and an intensity of the light that passes through the second optical element is detected. Thus, a small device with a simple structure that can detect the wavelength and intensity of light is provided.

BRIEF DESCRIPTION OF THE DRAWINGS

FIG. 7 is a schematic diagram illustrating a laser light source device according to a second embodiment of the present invention;

FIG. 8 is a sectional view illustrating the structure of an optical wedge;

DETAILED DESCRIPTION

Embodiments of the present invention will be described with reference to the drawings.

Laser Light Source Device of First Embodiment

Figure 1:
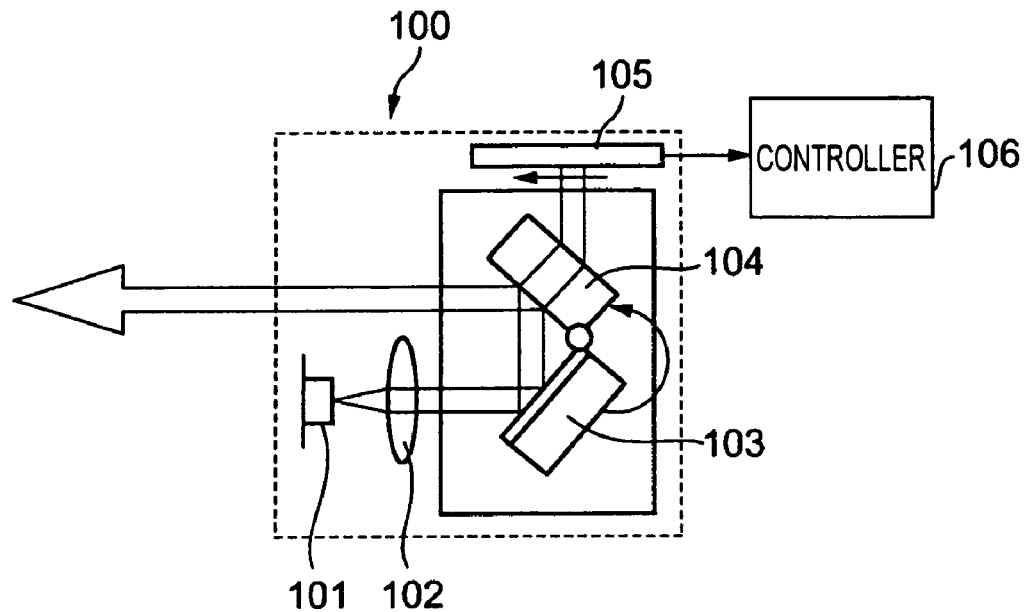
FIG. 1 is a schematic diagram illustrating a laser light source device according to a first embodiment of the present invention.

FIG. 1 is a schematic diagram illustrating a laser light source device according to a first embodiment of the present invention.

As shown in FIG. 1, a laser light source device 100 includes a laser diode 101, a collimating lens 102, a diffraction grating 103, a partially transmissive mirror 104, a split photodetector 105, and a controller 106. The laser diode 101 emits multimode laser light, for example, blue laser light with a wavelength of about 410 nm. The collimating lens 102 collimates the laser light emitted from the laser diode 101.

Figure 2:
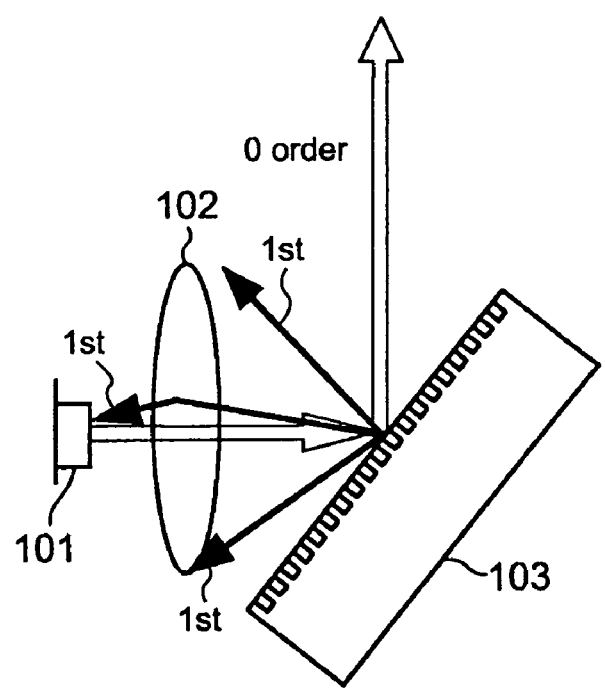
FIG. 2 is a diagram illustrating the operation of an external cavity.

As shown in FIG. 2, the diffraction grating 103 emits first-order light in different directions depending on the wavelength of the light, and the angle of the diffraction grating 103 with respect to the laser diode 101 is set such that the first-order light with a predetermined wavelength (e.g., 410 nm) returns to the laser diode 101. Accordingly, only the light component with the predetermined wavelength is amplified in the laser diode 101, and the thus the single mode light is obtained. Most of the laser light emitted from the laser diode 101 is not the first-order light but is zero-order light, which is reflected by the diffraction grating 103 like a mirror. Accordingly, the laser light source device 100 is basically a Littrow external cavity laser.

The partially transmissive mirror 104 reflects the zero-order light from the diffraction grating 103 in a predetermined direction other than a direction toward the diffraction grating 103 while transmitting a part of the zero-order light.

Figure 3:
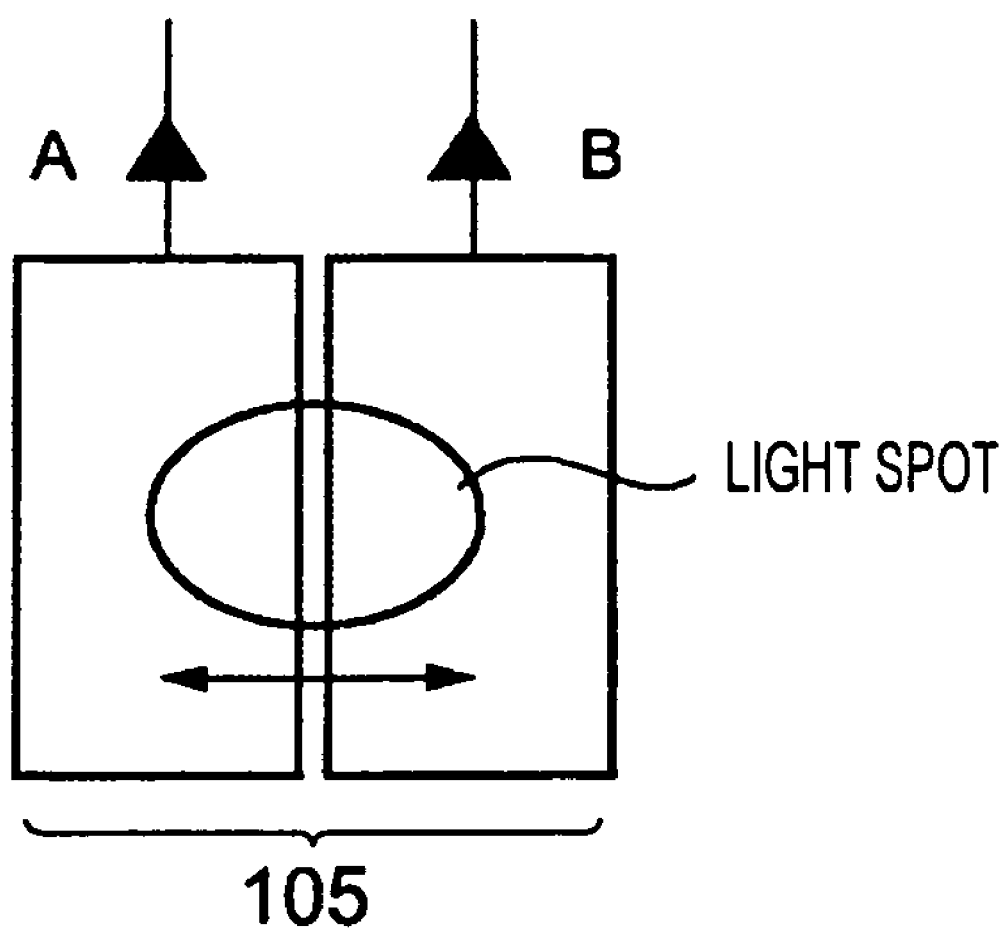
FIG. 3 is a plan view showing the structure of a split photodetector.

The split photodetector 105 is positioned such that the light that passes through the partially transmissive mirror 104 can be received. As shown in FIG. 3, the split photodetector 105 is split into two sections along a direction shown by the arrow in FIG. 1.

Figure 4:
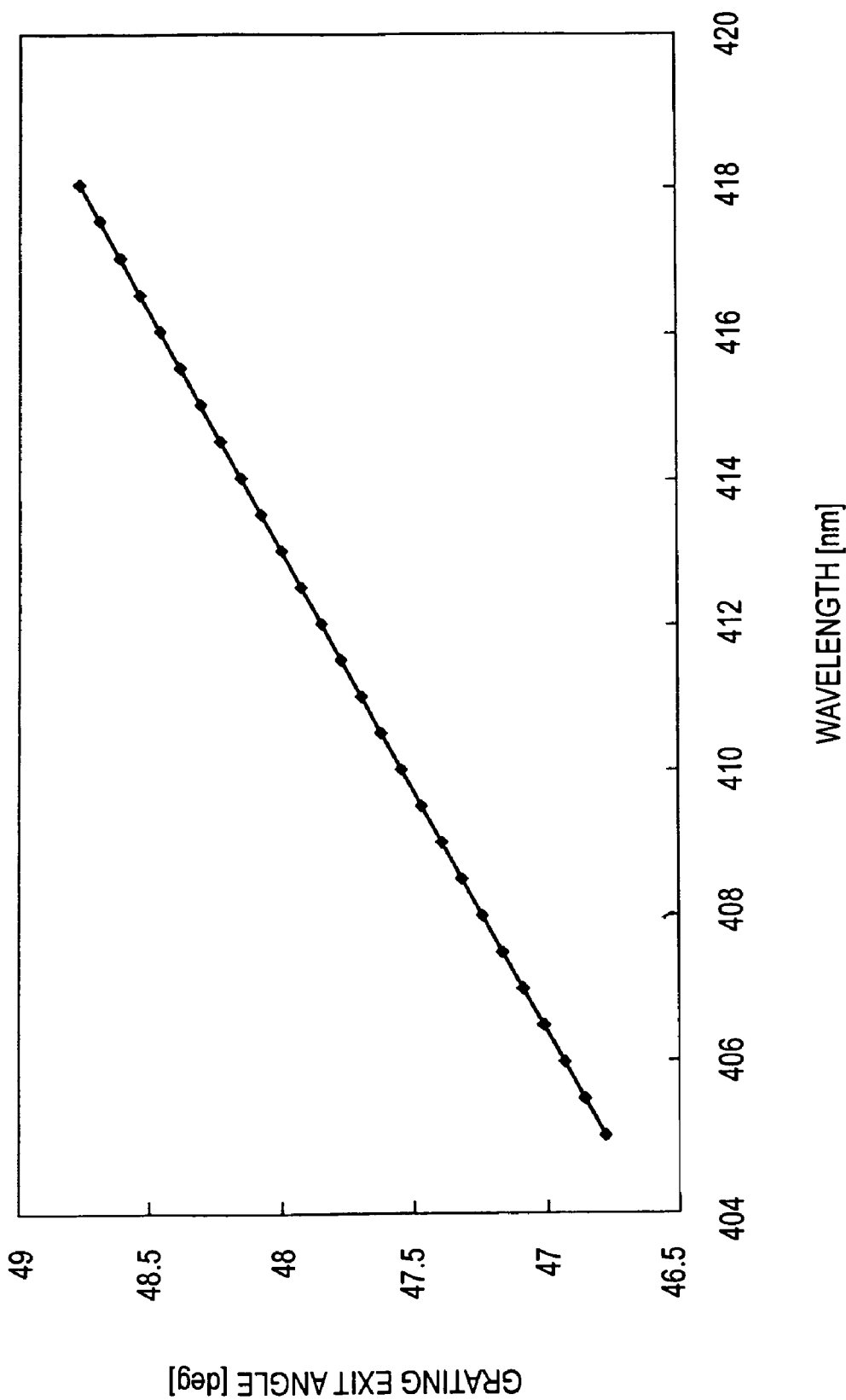
FIG. 4 is a graph showing the relationship between the wavelength of light and the grating exit angle.

As shown in FIG. 4, for example, the grating exit angle differs depending on the wavelength of light. More specifically, the direction of the light varies along the arrow shown in FIG. 1 depending on the wavelength thereof. Outputs A and B of the split photodetector 105 vary depending on the variation in the above-described direction of the light. Accordingly, the wavelength can be determined by detecting the variations in the outputs A and B of the split photodetector 105.

More specifically, in FIG. 3, the laser light is radiated onto the split photodetector 105 and moves in the direction shown by the arrow as the wavelength thereof varies. The position of light can be obtained using photocurrents A and B obtained from the split photodetector 105 as follows:

Position (Wavelength)=$(A-B)/(A+B)$

In addition, the amount of light can be obtained as follows:

Amount of Light=$A+B$

However, when the beam diameter is larger than the split photodetector 105, each "position" of the laser light and the corresponding "amount of light" are measured in advance to make a table thereof. In the actual measurement of the amount of light, first, the "position" on the split photodetector 105 is obtained. Then, the above-mentioned table is referred to for the corresponding "amount of light", and the ratio with respect to the amount of light is measured as a current output.

Figure 5:
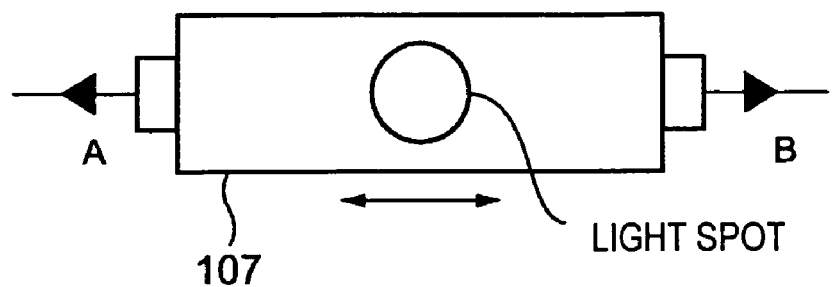
FIG. 5 is a plan view illustrating the structure of a position detector.

Alternatively, as shown in FIG. 5, a position detector 107 may also be used in place of the split photodetector 105. The position detector 107 detects the position of light along the direction shown by the arrow in FIG. 1. More specifically, as the wavelength varies, the radiation position of light moves along the direction shown by the arrow. Similar to the above-described case, the position of light can be obtained using photocurrents A and B as follows:

Position (Wavelength)=$(A-B)/(A+B)$

In addition, the amount of light can be obtained as follows:

Amount of Light=$A+B$

Figure 6:
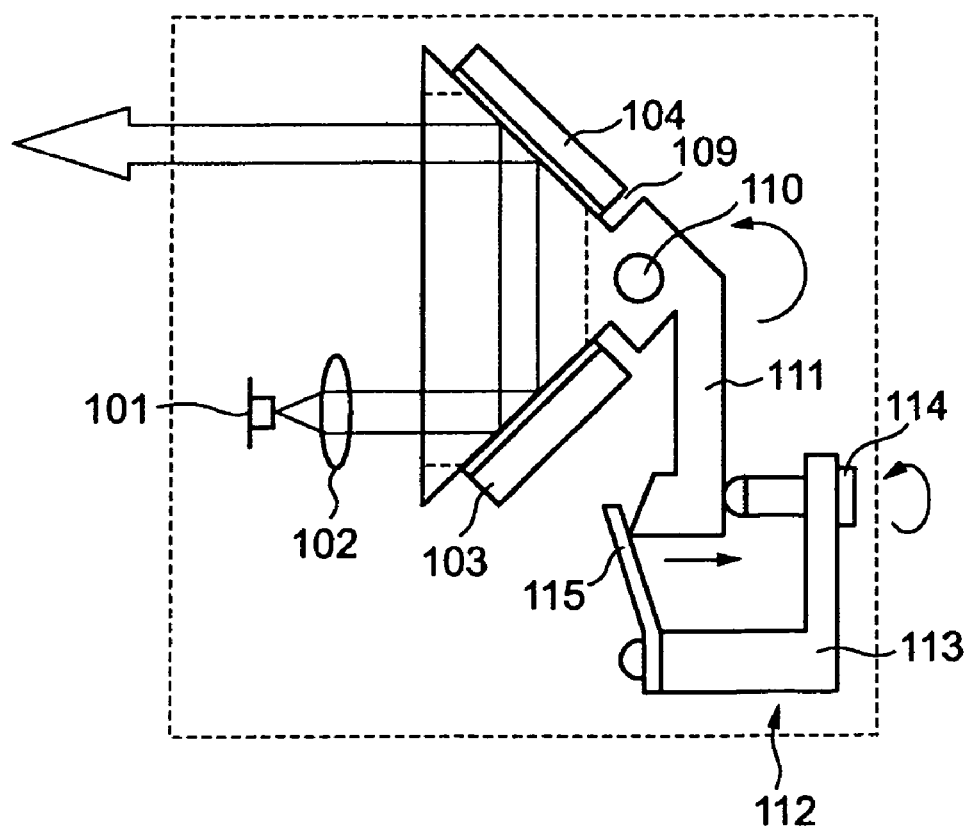
FIG. 6 is a diagram illustrating a rotating mechanism of a diffraction grating and the partially transmissive mirror.

As shown in FIG. 6, the diffraction grating 103 and the partially transmissive mirror 104 are retained by a retaining member 109 so that the angle between the reflective surface of the diffraction grating 103 and that of the partially transmissive mirror 104 is maintained at a predetermined angle. Accordingly, even when the diffraction grating 103 rotates, the emission direction of the laser light can be fixed by the partially transmissive mirror 104.

The retaining member 109 is rotatably supported by a shaft 110. The retaining member 109 is, for example, triangular in cross section and is hollow. In the retaining member 109, the diffraction grating 103 and the partially transmissive mirror 104 are fixed by, for example, an adhesive at one side of the shaft 110, and a rotating shaft 111 is integrally formed at the other side of the shaft 110. The retaining member 109 is, of course, provided with windows for exposing the surfaces of the diffraction grating 103 and the partially transmissive mirror 104 to the inside of the retaining member 109 and a window through which light exits. In addition, the line of intersection between the extensions of the surfaces of the diffraction grating 103 and the partially transmissive mirror 104 coincides with the centerline of the shaft 110.

A rotation driver 112 rotates the retaining member 109 around the shaft 110, and includes a main body 113, a screw 114 for pushing the rotating shaft 111, and a leaf spring 115 for applying an elastic force to the rotating shaft 111 in a direction opposite to the direction in which the rotating shaft 111 is pushed by the screw 114. The screw 114 is rotated by, for example, a rotation drive motor (not shown)

In the present embodiment, the wavelength of the blue laser light, which is about 410 nm, can be varied by around 5 nm to 10 nm by rotating the diffraction grating 103.

The controller 106 controls the wavelength and intensity of the laser light emitted from the laser light source device 100 on the basis of the detection result obtained by the split photodetector 105. For example, the wavelength of the laser light is adjusted to a desired wavelength by rotating the diffraction grating 103 with the rotation drive motor on the basis of the detection result obtained by the split photodetector 105. In addition, the intensity of the laser light emitted from the laser light source device 100 is adjusted to a desired intensity by controlling the current that flows through the laser diode 101 on the basis of the detection result obtained by the split photodetector 105.

Next, the operation of the laser light source device 100 structured as described above will be described.

The laser light emitted from the laser diode 101 is collimated by the collimating lens 102. In the laser light, the zero-order light is reflected first by the diffraction grating 103 and then by the partially transmissive mirror 104, and is output as output light.

A part of the zero-order light passes through the partially transmissive mirror 104 and is radiated onto the split photodetector 105. The radiation position varies along the direction shown by the arrow in FIG. 1 in accordance with the wavelength of the light.

The detection result obtained by the split photodetector 105 is transmitted to the controller 106, and the controller 106 controls the wavelength and intensity of the laser light emitted from the laser light source device 100.

In the laser light source device 100 according to the present embodiment, the optical element for guiding the output light in a desired direction normally by reflection is constituted of the partially transmissive mirror 104. The wavelength and intensity of light are determined on the basis of the radiation position of the light that passes through the partially transmissive mirror 104. Therefore, it is not necessary to use an additional optical element, for example, a half mirror, to guide the light toward means for detecting the wavelength or intensity. Accordingly, the structure is made simpler and the device size is reduced.

Laser Light Source Device of Second Embodiment

FIG. 7 is a schematic diagram illustrating a laser light source device according to a second embodiment of the present invention.

As shown in FIG. 7, a laser light source device 200 differs from the laser light source device according to the first embodiment in that a shear plate 201 is provided on an optical path of light reflected by a partially transmissive mirror 104 and light reflected by the shear plate 201 is detected by a split photodetector 202. Components similar to those of the first embodiment are denoted by the same reference numerals, and explanations thereof are thus omitted. An optical wedge, for example, may be used as the shear plate 201.

As shown in FIG. 8, the optical wedge (hereafter identified by reference numeral 201) is a glass plate in which an angle between the opposing surfaces is several tens of degrees.

Figure 9:
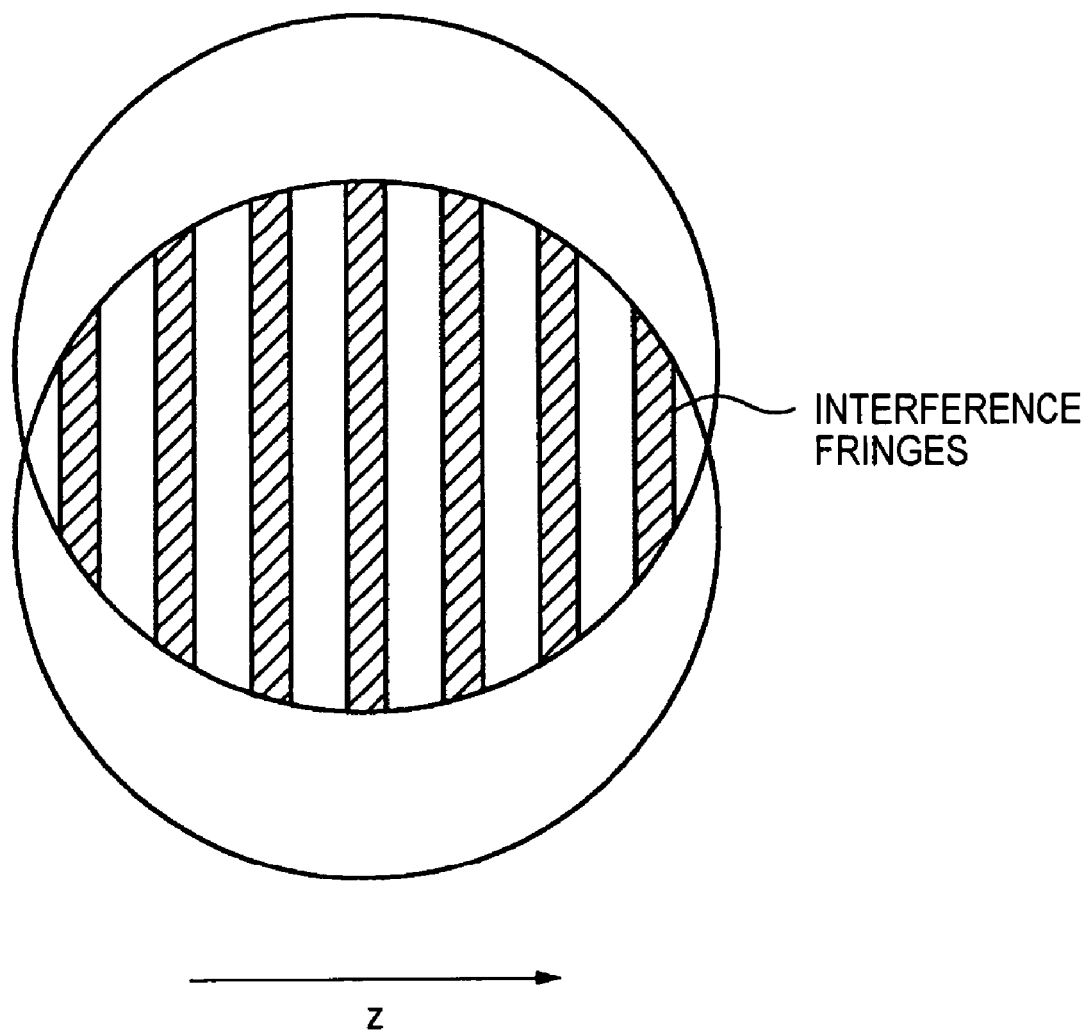
FIG. 9 is a diagram illustrating the function of the optical wedge.

When laser light is incident on this glass plate at an angle of 45°, light reflected by the front and back surfaces of the glass plate forms interference fringes (see FIG. 9).

In the interference fringes, the intensity of light at each position varies depending on the wavelength of light. Accordingly, the wavelength of light can be determined by detecting the intensities of light at two predetermined positions using the split photodetector 202 and comparing them using the controller 106.

In the present embodiment, since the wavelength of light is detected using the interference fringes, the wavelength of light can be detected more accurately. The wavelength of the light can be detected still more accurately in a wider range when the split photodetector 105 is additionally used.

Example of Hologram Recording/Reproducing Apparatus

Next, a hologram recording/reproducing apparatus according to an embodiment of the present invention will be described.

Figure 10:
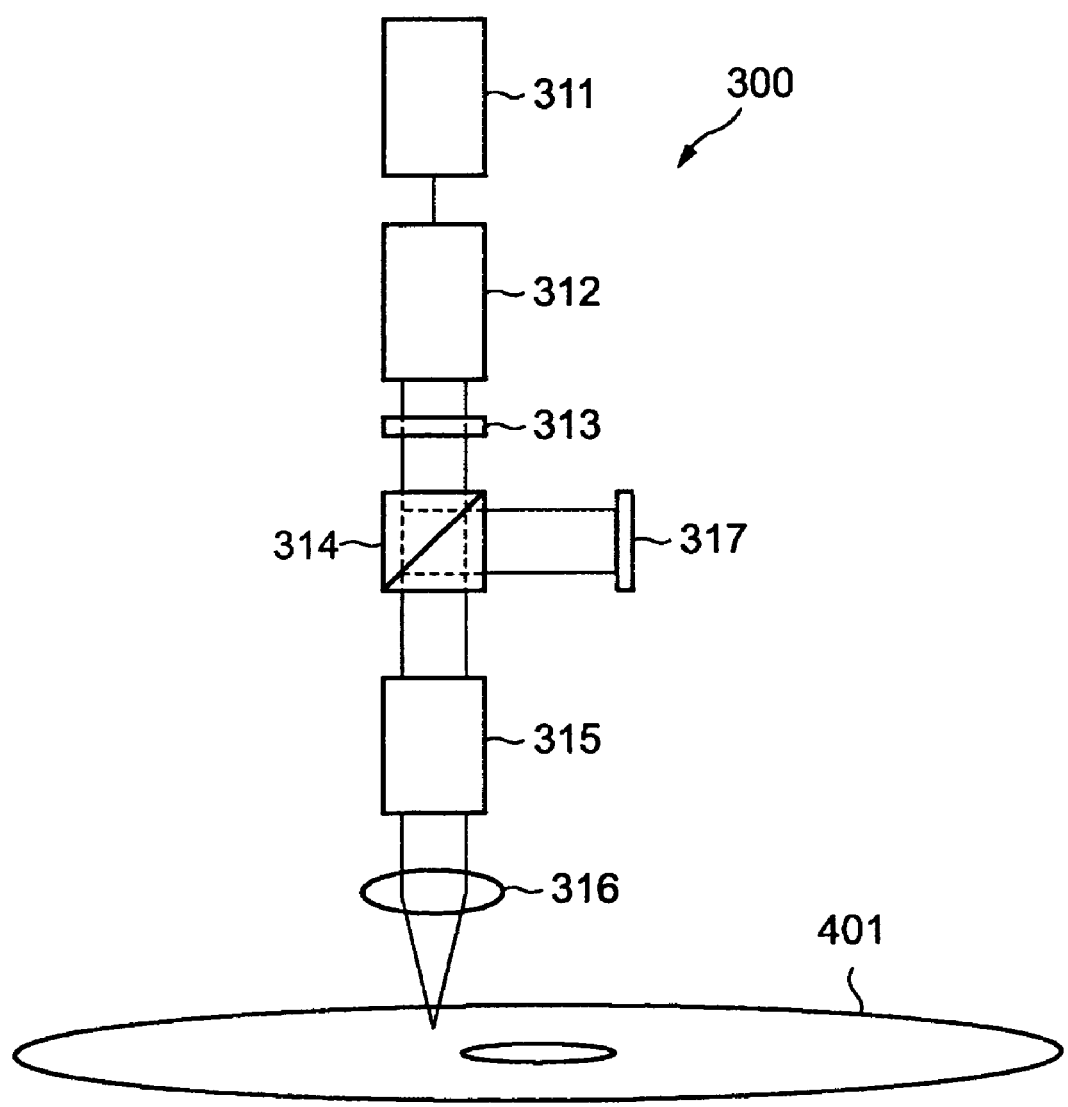
FIG. 10 is a schematic diagram illustrating an optical unit used in a hologram recording/reproducing apparatus according to another embodiment of the present invention.

FIG. 10 is a schematic diagram illustrating an optical unit 300 used in a hologram recording/reproducing apparatus according to the embodiment of the present invention. The optical unit 300 is of a so-called collinear type in which a single optical system is used for both signal light and reference light.

The optical unit 300 includes a recording/reproducing light source 311, a beam expander 312, a spatial light modulator 313, a partially transmissive mirror 314, a Faraday element 315, a lens 316, and a Charge Coupled Device (CCD) sensor 317.

The laser light source device 100 shown in FIG. 1 or the laser light source device 200 shown in FIG. 7 may be used as the recording/reproducing light source 311.

The beam expander 312 is an optical element that increases the diameter of the laser light emitted from the recording/reproducing light source 311.

Figure 11:
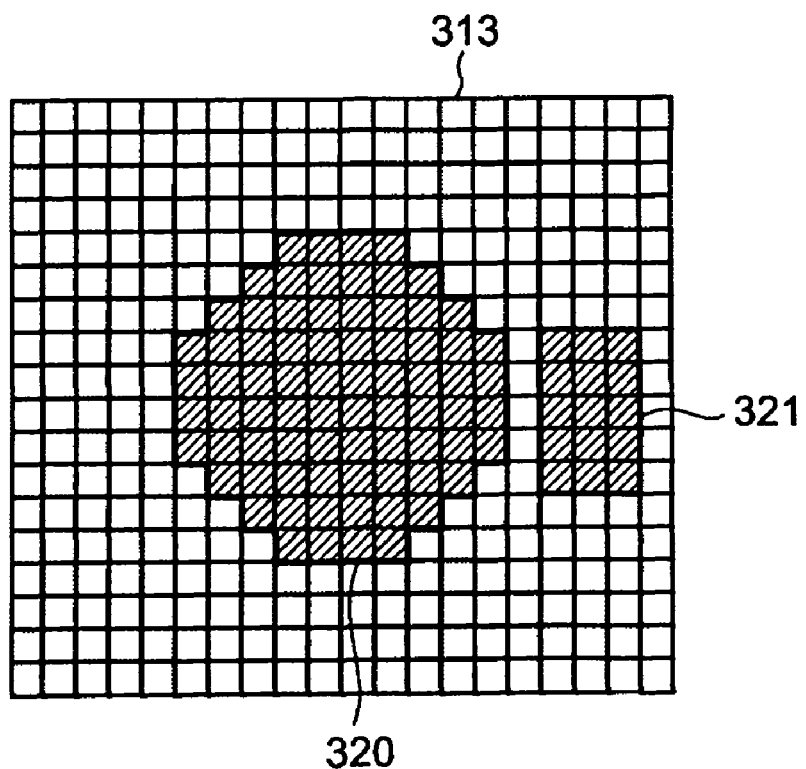
FIG. 11 is a plan view of a spatial light modulator.

The spatial light modulator 313 is an optical element that spatially (two-dimensionally in this embodiment) modulates the signal light to superimpose data signals. A transmissive ferroelectric liquid crystal element, which is a transmissive element, may be used as the spatial light modulator 313. Alternatively, a Digital Micromirror Device (DMD) and a reflective liquid crystal element, which are reflective elements, and a Grating Light Value (GLV) element may also be used as the spatial light modulator. As shown in FIG. 11, the spatial light modulator 313 has a substantially circular first area 320 through which the signal light passes and a second area 321 through which the reference light passes.

The Faraday element 315 is an optical element that rotates the polarizing direction of light by 45°. The polarizing direction of the signal light and the reference light is rotated by 45° by the Faraday element 315. In addition, the polarizing direction of light reflected by the hologram-recording medium 401 is further rotated by 45° by the Faraday element 315. Accordingly, the polarizing direction of the light reflected by the hologram-recording medium 401 is rotated by 90° with respect to the transmission axis of the partially transmissive mirror 314. Therefore, the light reflected by the hologram-recording medium 401 does not pass through the partially transmissive mirror 314 but is reflected toward the CCD sensor 317.

The lens 316 is an optical element that collects the signal light and the reference light onto the hologram-recording medium 401. An image (real image) displayed on the spatial light modulator 313 is transformed into a Fraunhofer diffraction image (Fourier transform image) at a focal position of the lens 316 while the reference light is also transformed into a Fraunhofer diffraction image (Fourier transform image) at the focal position of the lens 316. As a result, the signal light and the reference light interfere with each other on the hologram-recording medium 401 and a diffraction grating (hologram) is formed at the radiation point. In this manner, the data is recorded on the hologram-recording medium 401.

In addition, diffracted light reproduced from the hologram-recording medium 401 is collected at the CCD sensor 317 via the lens 316, the Faraday element 315, and the partially transmissive mirror 314. At this time, the real image that has been displayed on the spatial light modulator 313 is formed on a detection surface of the CCD sensor 317. More specifically, the lens 316 also functions as an inverse Fourier transform lens that performs inverse Fourier transform of the Fourier transform image of the spatial light modulator 313 recorded on the hologram-recording medium 401 and forms the obtained image on the CCD sensor 317.

The CCD sensor 317 is a light-receiving element that detects the reproduced signal light. More specifically, the CCD sensor 317 is a two-dimensional photodetector including light-receiving units arranged two-dimensionally.

Figure 12:
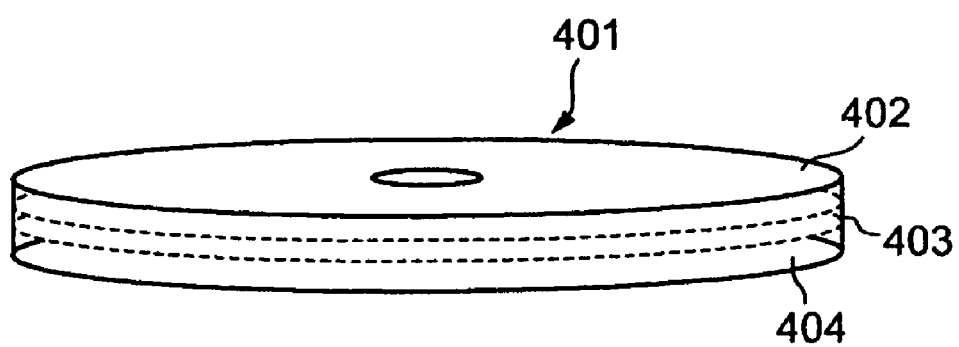
FIG. 12 is a perspective view showing the structure of a hologram-recording medium.

As shown in FIG. 12, the hologram-recording medium 401 is disc-shaped and includes a protecting layer 402, a recording layer 403, and a protecting layer 404. The hologram-recording medium 401 records the interference fringes formed by the signal light and the reference light.

The protecting layers 402 and 404 protect the recording layer 403 from the environment. The recording layer 403 records the interference fringes as variation in the refractive index (or transmissivity). The recording layer 403 may be made of any organic or inorganic material as long as the refractive index (or transmissivity) thereof varies in accordance with the intensity of light.

For example, a photorefractive material, such as lithium niobate ($LiNbO_3$), whose refractive index varies in accordance with the exposure due to the electrooptical effect, may be used as an example of an inorganic material.

In addition, a photopolymer may be used as an example of an organic material. In the photopolymer, monomer is evenly dispersed in a matrix polymer in the initial state. When light is radiated, monomer is polymerized in a region being exposed. As the polymerization proceeds, monomer in the surrounding region moves and the monomer density varies depending on the position.

As described above, the refractive index (or transmissivity) of the recording layer 403 varies depending on the exposure, so that the interference fringes generated by the interference between the reference light and the signal light can be recorded on the hologram-recording medium 401 as variation in the refractive index (or transmissivity).

The hologram-recording medium 401 is moved (in the radial direction of the hologram-recording medium 401) and rotated (along the circumference of the hologram-recording medium 401) by driving means (not shown), so that images on the spatial light modulator 313 can be recorded as a plurality of holograms. Instead of moving the hologram-recording medium 401 itself, the optical unit 300 may be moved in the radial direction of the hologram-recording medium 401.

It should be understood by those skilled in the art that various modifications, combinations, sub-combinations and alterations may occur depending on design requirements and other factors insofar as they are within the scope of the appended claims or the equivalents thereof.

The invention claimed is:

1. A laser light source device, comprising:
   a laser light source that emits multimode laser light;
   an optical element that collimates the laser light emitted from the laser light source;

a diffraction grating having a surface that reflects zero-order light in the collimated laser light in a predetermined direction other than a direction toward the laser light source and reflects first-order light in the collimated laser light toward the laser light source;

a partially transmissive mirror having a surface that reflects the zero-order light reflected by the diffraction grating in a predetermined direction while transmitting a part of the zero-order light reflected by the diffraction grating;

a shear plate including opposing first and second surfaces with an angle between the opposing first and second surfaces being several tens of degrees, wherein the shear plate is disposed in an optical path of the light reflected by the partially transmissive mirror, such that the light reflected by the partially transmissive mirror is incident on the first surface of the shear plate at an angle of 45'; and a device to detect a wavelength of light and including (i) a first detector that detects a position of the light that passes through the partially transmissive mirror and (ii) a second detector that detects an intensity of light reflected by the shear plate at a number of positions of an interference fringe formed from the light reflected by the partially transmissive mirror which is incident on the first and second surfaces of the shear plate, said device detecting the wavelength of the light using results from both the first detector and the second detector; and control means for controlling movement of the partially transmissive mirror with the diffraction grating, wherein, when the partially transmissive mirror with the diffraction grating moves based on control by the control means, an incidence angle of the laser light on the surface of the diffraction grating is changed while an angle between the surface of the diffraction grating and the surface of the partially transmissive mirror is maintained at a predetermined angle.

2. A hologram apparatus for recording or reproducing a hologram on a hologram-recording medium by wavelength division multiplexing, the hologram apparatus comprising:

a laser light source device including a laser diode that emits multimode laser light;

an optical element that collimates the laser light emitted from the laser diode;

a diffraction grating having a surface that reflects zero-order light in the collimated laser light in a predetermined direction other than a direction toward the laser diode and reflects first-order light in the collimated laser light toward the laser diode;

a partially transmissive mirror having a surface that reflects the zero-order light reflected by the diffraction grating in a predetermined direction while transmitting a part of the zero-order light reflected by the diffraction grating;

a shear plate including opposing first and second surfaces with an angle between the opposing first and second surfaces being several tens of degrees, wherein the shear plate is disposed in an optical path of the light reflected by the partially transmissive mirror, such that the light reflected by the partially transmissive mirror is incident on the first surface of the shear plate at an angle of 45; and a device to detect a wavelength of light and including (i) a first detector that detects a position of the light that passes through the partially transmissive mirror and (ii) second detector that detects an intensity of light reflected by the shear plate at a number of positions of an interference fringe formed from the light reflected by the partially transmissive mirror which is incident on the first and second surfaces of the shear plate, said device detecting the wavelength of the light using results from both the first detector and the second detector; and control means for controlling movement of the partially transmissive mirror with the diffraction grating, wherein, when the partially transmissive mirror with the diffraction grating moves based on control by the control means, an incidence angle of the laser light on the surface of the diffraction grating is changed while an angle between the surface of the diffraction grating and the surface of the partially transmissive mirror is maintained at a predetermined angle.

3. A method for detecting laser light, comprising:

emitting multimode laser light;

collimating the emitted laser light;

reflecting zero-order light in the collimated laser light in a predetermined direction other than a direction toward an emission point and reflecting first-order light in the collimated laser light toward the emission point by use of a surface of a diffraction grating;

reflecting by use of a surface of a partially transmissive mirror the reflected zero-order light in a predetermined direction while transmitting a part of the reflected zero-order light;

disposing a shear plate, the shear plate including opposing first and second surfaces with an angle between the opposing first and second surfaces being several tens of degrees, in an optical path of the light reflected by the partially transmissive mirror, such that the light reflected by the partially transmissive mirror is incident upon the first surface of the shear plate at angle of 45 and the shear plate reflects the light reflected by the partially transmissive mirror incident on the first and second surfaces of the shear plate to form an interference fringe; and detecting a wavelength of light by use of a device which includes (i) a first detector that detects a position of the light that passes through the partially transmissive mirror and (ii) a second detector that detects an intensity of the light reflected by the first and second surfaces of the shear plate at a number of positions of the interference fringe, said wavelength of the light being detected by using results from both the first detector and the second detector; and moving the partially transmissive mirror with the diffraction grating to change an incidence angle of the laser light on the surface of the diffraction grating while maintaining an angle between the surface of the diffraction grating and the surface of the partially transmissive mirror at a predetermined angle.

* * * * *